(12) United States Patent
Song et al.

(10) Patent No.: US 6,458,632 B1
(45) Date of Patent: Oct. 1, 2002

(54) UMOS-LIKE GATE-CONTROLLED THYRISTOR STRUCTURE FOR ESD PROTECTION

(75) Inventors: Jun Song, Singapore (SG); Guang Ping Hua, Singapore (SG); Keng-Foo Lo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/814,478

(22) Filed: Mar. 14, 2001

(51) Int. Cl.[7] ............................................. H01L 21/332
(52) U.S. Cl. ...................... 438/133; 438/270; 438/271; 438/416; 438/429; 257/136; 257/138; 257/139
(58) Field of Search ................... 438/270, 271, 438/416, 429; 257/136, 138, 139, 330

(56) References Cited

U.S. PATENT DOCUMENTS

| | | | |
|---|---|---|---|
| 5,324,966 A | * 6/1994 | Muraoka et al. | 257/136 |
| 5,576,557 A | 11/1996 | Ker et al. | 257/173 |
| 5,682,048 A | 10/1997 | Shinohara et al. | 257/342 |
| 5,940,689 A | 8/1999 | Rexer et al. | 438/133 |
| 6,323,090 B1 | * 11/2001 | Zommer | 438/270 |

\* cited by examiner

*Primary Examiner*—David Nelms
*Assistant Examiner*—Mai-Huong Tran
(74) *Attorney, Agent, or Firm*—George O. Saile; Rosemary L. S. Pike (57) ABSTRACT

Described is a method of creating a MOS gate-controlled SCR (UGSCR) structure with a U-shaped gate (UMOS) for an ESD protection circuit in an IC device which is compatible with shallow trench isolation (STI) and self-aligned silicide (salicide) fabrication technology. The UMOS gate is located in a p-substrate and is surrounded by an n-well on either side. Adjacent to one side of the UMOS gate, a first n+ diffusion is formed which straddles the first n-well. The n+ diffusion together with a p+ pickup diffused next to it form the cathode of the SCR (thyristor). Adjacent to the other side of the UMOS gate, a second n+ and p+ diffusion are formed in a second n-well. The second n+ and p+ diffusion together with the UMOS gate form the anode of the SCR and the input terminal of the circuit to be protected. The SCR is formed by the first n+ diffusion/n-well (cathode), the p-substrate, the second n-well and the second p+/n+ diffusion (anode). A latchup immune circuit is achieved by creating a U-shaped gate structure which is lined with a thick gate oxide—similar to a field oxide—under the poly gate.

10 Claims, 7 Drawing Sheets

UMOS-LIKE GATE-CONTROLLED THYRISTOR STRUCTURE FOR ESD PROTECTION

BACKGROUND OF THE INVENTION

1. Field of the Invention

The invention relates to electrostatic discharge (ESD) structures for sub-micron devices, and more particularly to a thyristor (silicon controlled rectifier) which is gated by a U-type gate structure of a MOS (UMOS) transistor.

2. Description of the Related Art

The Silicon Controlled Rectifier (SCR) is the most efficient of all protection devices in terms of ESD performance per unit area. Usually, the SCR trigger level is quite high. The Low Voltage Trigger SCR (LVTSCR) is the most promising device for ESD protection by surface channel to reduce the drain-tap junction avalanche breakdown. Recently, reports have shown that LVTSCR's with shallow trench isolation (STI), especially on epi, are not functional because the hole current cannot efficiently forward bias the n+ cathode/p-substrate junction. Also, the silicidation process for reducing electrostatic discharge (ESD) performance is still a concern and needs to be evaluated for deep-quarter-micron (1 micron=$10^{-6}$ meters) technologies. Therefore, it is very useful to invent a new type of thyristor structure with a low controllable trigger voltage that is compatible with self-aligned silicide and STI fabrication technology without adding any process complexity and cost.

Below are listed U.S. Patents which describe gate controlled SCR structures employing a Trench-Gated MOS (UMOS) structure that will provide a low trigger voltage to prevent damage during an ESD event are:

U.S. Pat. No. 5,940,689 (Rexer et al.), U.S. Pat. No. 5,682,048 (Shinohara et al.), and U.S. Pat. No. 5,324,966 (Muraoka et al.) each describe the structure of the Trench-Gated MOS device. Muraoka et al. describes this structure to implement a thyristor.

U.S. Pat. No. 5,576,557 (Ker et al.) describes a low voltage trigger SCR for application to an ESD protection circuit.

SUMMARY OF THE INVENTION

It is an object of the present invention is to provide a MOS gate-controlled SCR (UGSCR) structure for an ESD protection circuit in an IC device that is compatible with shallow trench isolation (STI) and self-aligned silicide (salicide) fabrication technology without adding any process complexity and cost.

It is another object of the invention to provide a MOS gate-controlled SCR structure for an ESD protection circuit in an IC device, which can give a low clamping voltage in the order of 1 to 2 V for deep-quarter-micron (1 micron= $10^{-6}$ meters) process application.

It is yet another object of the present invention to provide the UGSCR with a low impedance state when "on", of about 1 to 3 ohms to make the UGSCR a low power dissipating device for ESD protection.

It is still another object of the present invention to provide a CMOS latchup immune circuit by insuring that the threshold voltage of the UMOS-like gate is larger than the Vdd voltage.

These and many other objects have been achieved by creating a structure and a method in which a parasitic thyristor (or SCR) has a UMOS-like gate structure. The UMOS-like gate structure consists of a U-type gate flanked on either side by an n-well or in the alternative by a p-well. The U-type gate is connected on one side to an adjacent p+ diffusion which is the anode. On the other side of the gate and also adjacent to it is an n+ diffusion which is the cathode. The latchup immune circuit is achieved by creating a U-shaped gate structure which is lined with a thick gate oxide—similar to a field oxide—under the poly gate.

These and many other objects and advantages of the present invention will be readily apparent to one skilled in the art to which the invention pertains from a perusal of the claims, the appended drawings, and the following detailed description of the preferred embodiments.

Note that the figures herein illustrate vertical cross sections of devices and that the devices extend laterally (into and/or out of the page) in a manner appreciated by those skilled in the art.

DESCRIPTION OF THE PREFERRED EMBODIMENT

Figure 1:
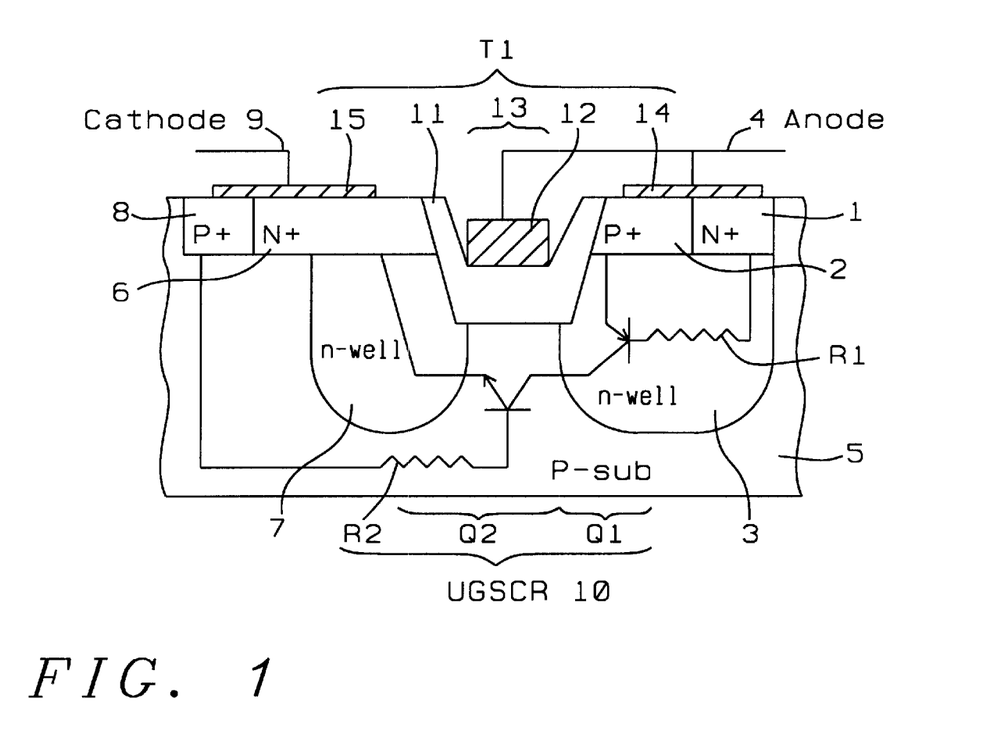
FIG. 1 is a cross-sectional view of the present invention.

In the invention, a novel U-gate MOS (UMOS)-like gate-controlled SCR structure (UGSCR) is provided, see FIG. 1. The adjacent n+ (1) and p+ (2) diffusions in the n-well (3) are connected to the input terminal (4). A vertical parasitic pnp device (transistor) is formed with the p-substrate (5) as the collector, n-well (3) as the base, and input p+ (2) diffusion as the emitter. The n+ (6) diffusion partially on the n-well (7) located in the p-substrate (5), along with a p+ pick-up (8), is connected to the ground (9) or substrate bus and forms the emitter of the parasitic npn transistor. The base of the parasitic npn transistor is formed by the p-substrate (5) and the collector is the n-well (3) and the n-well contact (1). A UMOS-like MOS gate structure (13), comprised of a layer of silicon dioxide (11) and polysilicon gate (12) is formed between the two n-wells (3 and 7) and its gate (12) is connected to the input terminal (4).

Figure 2:
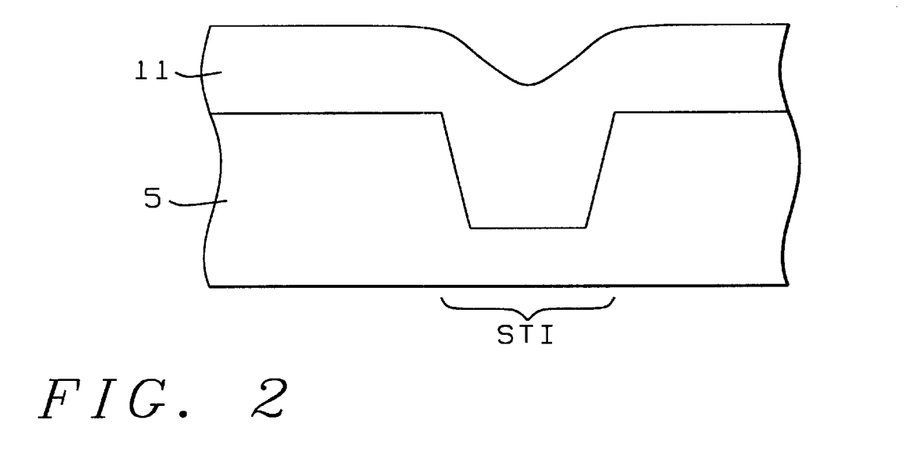
FIGS. 2–4 depict the process flow for forming a U-like gate structure.
Figure 3:
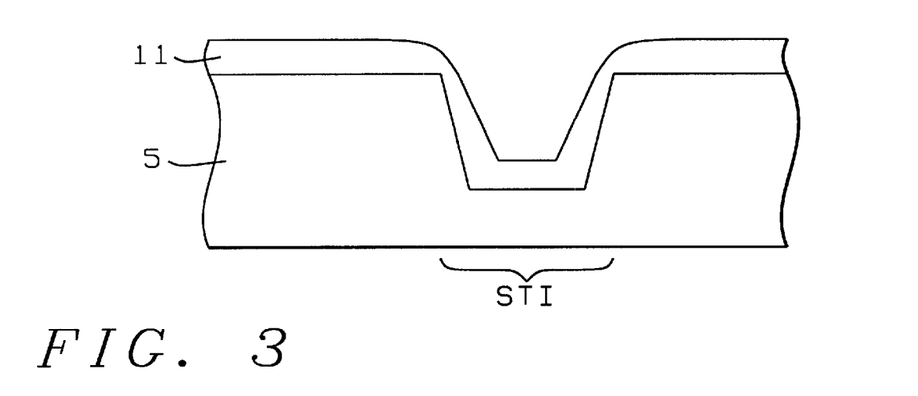
Figure 4:
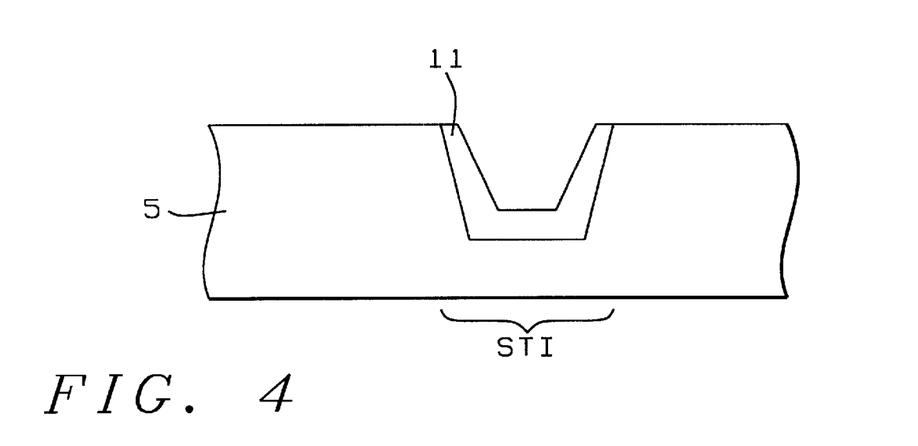

The UGSCR structure is compatible with the self-aligned silicide process and shallow trench isolation (STI) fabrication technology, without adding any process complexity and cost. FIG. 2 shows a shallow trench isolation (STI) in p-substrate (5) having a "U"-type gap covered with a conformal layer of silicon dioxide (11). FIG. 3 depicts the U-type gap after an active reverse etch back. After chemical mechanical polishing (CMP) all silicon dioxide is removed from the top surface of the p-substrate as shown in FIG. 4.

During normal circuit operation, CMOS latch-up should not be a problem since the threshold voltage of the UMOS-like gate is larger than the Vdd supply voltage (the thick gate oxide under the poly gate is somewhat like the field oxide) and the emitter and base of the parasitic pnp transistor are at the same potential (FIG. 1).

During an ESD stress pulse, when the gate voltage of the UGSCR increases, there is a depletion region formed under the UMOS-like gate. There are two competitive mechanisms for UGSCR trigger in the preferred embodiment of the present invention. The first one is that the gate voltage will reduce the n-well (3)/ p-substrate (5) breakdown voltage due to local electrical field localization in the trench corner region and the breakdown will occur before the channel is formed under the poly gate (12). The second mechanism is that there will be an inversion layer formed under the UMOS-like gate if the threshold voltage of the UMOS-like gate is less than the n-well/p-substrate breakdown voltage.

After the collector (5) to base (3) junction of the pnp transistor goes into avalanche breakdown or an inversion layer is formed under the poly gate (12), there will be an electron current in the n-well (3). The electron current will produce a potential in n-well (3) which can forward-bias the emitter (2) to base (3) junction of the pnp transistor. Then, holes will be injected from the p+ emitter (2) to the n-well (3). Some of the holes will recombine with the electrons from the n-channel region or breakdown region and some of the holes will go through the p-substrate and will be collected by the p+ pick-up (8). The later one will produce a voltage drop in p-substrate (5) which forward-biases the emitter (7) to base (5) junction of the npn transistor, thus turning it on.

The npn transistor current from its collector (n-well (3)) to its emitter (cathode (9)) now supplies the forward-bias of the p+ emitter (2) n-well base (3) for the pnp transistor. The voltage at the anode no longer needs to provide the bias for the pnp transistor, and the voltage between the anode and the cathode begins to decrease resulting in a negative resistance region. Once on, the UGSCR can be modeled as a p-i-n diode, i.e., a p-i-n junction diode including an intrinsic semiconductor layer, inserted between a p-doped layer and an n-doped layer. The region between the anode and cathode of the UGSCR is now fully conductivity modulated, and the on-resistance of the UGSCR is about 1 to 3 ohms making it a low power dissipating device ideal for ESD protection.

Usually, the turn-on of the pnp transistor occurs in less than 1 ns (1 ns=$10^{-9}$ seconds) and this leads to the regenerative pnpn action. Once the UGSCR is turned on the device is in a low impedance state and the anode to cathode clamping voltage is of the order of 1 V to 2 V in a sub-micron (1 micron=$10^{-6}$ meters) process. This dramatically reduces the power dissipation and results in an improved ESD performance.

The nature of the device operation means that it is not influenced by salicidation (self-aligned silicidation) which is a big advantage in advanced CMOS processes. Also, the ESD implant is not necessary for the device and the ESD implant process can be skipped without adding any process complexity and cost.

In the illustrated embodiments the process of the invention is shown by way of to illustration and not of limitation, as applied either to the structure or the methods disclosed.

Referring once again to FIG. 1, we describe in greater detail the UMOS-like gate-controlled thyristor=UGSCR (10) for electrostatic discharge (ESD) protection. In a semiconductor wafer with a p-substrate (5) there is deposed a first (7) and a second n-well (3), separated from each other by a U-gate MOS (UMOS)-like gate structure (13), where the first and the second n-well, and the UMOS-like gate structure together form a MOS transistor T1. The UMOS-like gate structure further comprises a U type trench lined with a silicon dioxide layer (11) a polysilicon layer (12) disposed on top of silicon dioxide layer (11). The UMOS-like gate structure acts as the gate of the thyristor (UGSCR).

A first n+ diffusion (6) is disposed on one side of, and adjacent to, UMOS-like gate structure (13), and is located partially over first n-well (7) and p-substrate (5). Adjacent to first n+ diffusion (6) is disposed a first p+ diffusion (8), which acts as a p+ pickup, and where first n+ diffusion (6) and first p+ diffusion (8) are the cathode of thyristor (10). A first metal layer (15) is deposited over the first n+ diffusion and the first p+ diffusion to provide the contact for the cathode of the thyristor. The cathode is typically connected to a ground potential or alternately to substrate (5). A second p+ diffusion (2) is disposed on the other side of, and adjacent to, the UMOS-like gate structure (13). Adjacent to the second p+ diffusion is a second n+ diffusion (1), where 10 second p+ diffusion (2) and second n+ diffusion (1) are disposed over the second n-well (3). A second metal layer (14) is deposited over the second p+ and n+ second t2 diffusion. A conductive connection is made between the second metal layer (14), and the gate of thyristor (10), which together form the anode (4) of the thyristor. The anode in turn is connected to an input of the circuit to be protected from ESD.

The thyristor itself is further comprised of (a) a parasitic npn bipolar transistor Q2, where the emitter, the base, and the collector are formed by first n-well (7), p-substrate (5), and second n-well (3), respectively, and (b) a parasitic pnp bipolar transistor Q1, where the emitter, base, and collector are formed by second p+ diffusion (2), second n-well (3), and p-substrate (5), respectively.

CMOS latchup is prevented because the threshold voltage of the UMOS-like gate structure (13) is larger than a supply voltage Vdd of a circuit to be protected.

The above described preferred embodiment of the UMOS-like gate-controlled thyristor includes its complement as well, such that when the n– and p– conductivity type, the cathode and anode, and npn and pnp transistors are interchanged a thyristor results which is based on an n-substrate with p-wells without changing the function of the thyristor.

Referring once again to FIG. 1, the preferred method for manufacturing the present invention requires the following steps:

diffusing into p-substrate (5) a first and a second n-well (7) and (3), respectively, creating a UMOS-like gate structure (13) by the steps of:
  forming between the first and the second n-well a U type trench in the form of a shallow trench isolation (STI), and depositing silicon dioxide (11), as shown in FIG. 2,
  etching back the silicon dioxide (11) in an active reverse etch back, per FIG. 3,
  planarizing with CMP until the silicon dioxide is removed from the surface of the p-substrate, as in FIG. 4,
  and referring back to FIG. 1, depositing a polysilicon layer (12) on top of the silicon dioxide layer, where the UMOS-like gate structure acts as the gate of the thyristor (UGSCR),
depositing a first n+ diffusion (6) on one side of, and adjacent to, UMOS-like gate structure (13), placing first p+ diffusion (8) partially over the first n-well and the p-substrate,
depositing a first p+ diffusion (8) adjacent to first n+ diffusion (6), where the first n+ diffusion and the first p+ diffusion are the cathode (9) of thyristor (10),
depositing a first metal layer (15) over the first n+ and first p+ diffusions thus providing the contact for cathode (9) of thyristor (10),
depositing into the second n-well (3) a second p+ diffusion (2) on the other side of, and adjacent to, the UMOS-like gate structure, depositing into the second n-well a second n+ diffusion (1) adjacent to the second p+ diffusion, depositing a second metal layer (14) over the second p+ and second n+ diffusions, connecting conductively the second metal layer (14) and the gate (12) of the thyristor, all thus forming the anode (4) of the thyristor, where the above steps further provide:
a parasitic npn bipolar transistor Q2, where the emitter, base, and collector are formed by first n-well (7), p-substrate (5), and second n-well (3), respectively, and a parasitic pnp bipolar transistor Q1, where the emitter, base, and collector are formed by second p+ diffusion (2), second n-well (3), and p-substrate (5), respectively.

In all figures like parts are identified by like numerals.

In the above described method for producing a UMOS-like gate-controlled thyristor the n– and p-type structures, the cathode and anode, and the npn and pnp transistors can be interchanged to produce a thyristor which is based on an n-substrate with p-wells without changing the function of the thyristor.

Key process steps for the UGSCR production in 0.25 um process are shown in FIGS. 5 to 10, and discussed next.

Figure 5:
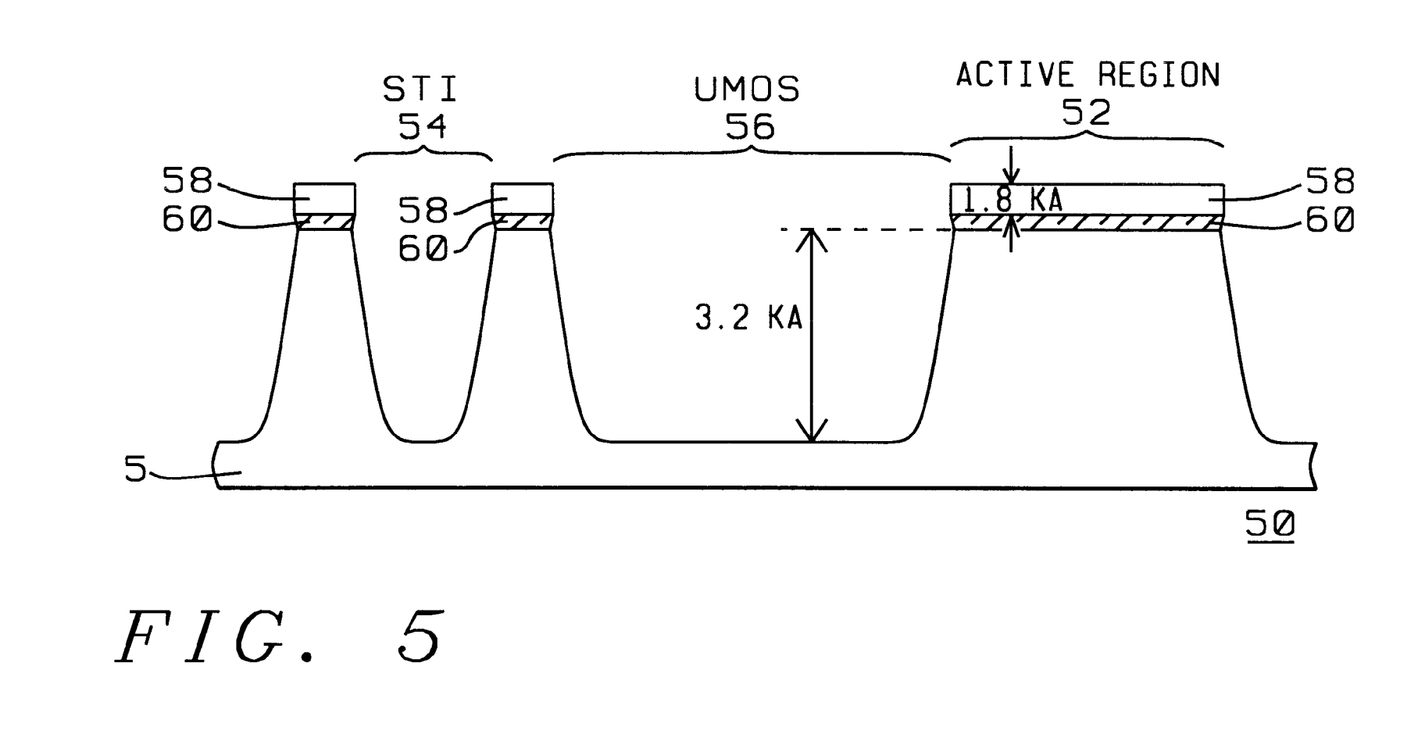
FIGS. 5 through 10 are cross-sectional views of key process steps for the UGSCR structure in a 0.25 micron process according to the preferred embodiment of the present invention.

FIG. 5 shows a semiconductor wafer (50) with a p-substrate (5) after active (52) and STI (54) regions have been defined. Another STI region (56) identifies the site of a UMOS-like gate structure. The top surface of the semiconductor wafer is covered by an approximately 1,800 Angstrom=1.8 kA (1 Angstrom=$10^{-1}$ meter) thick SiN-layer (58), typically silicon nitride $Si_3N_4$. Below the SiN layer is a thin oxidized layer of silicon (60). Regions (56) and (54) are etched to a depth of about 3,200 Angstrom (3.2 kA).

Figure 6:
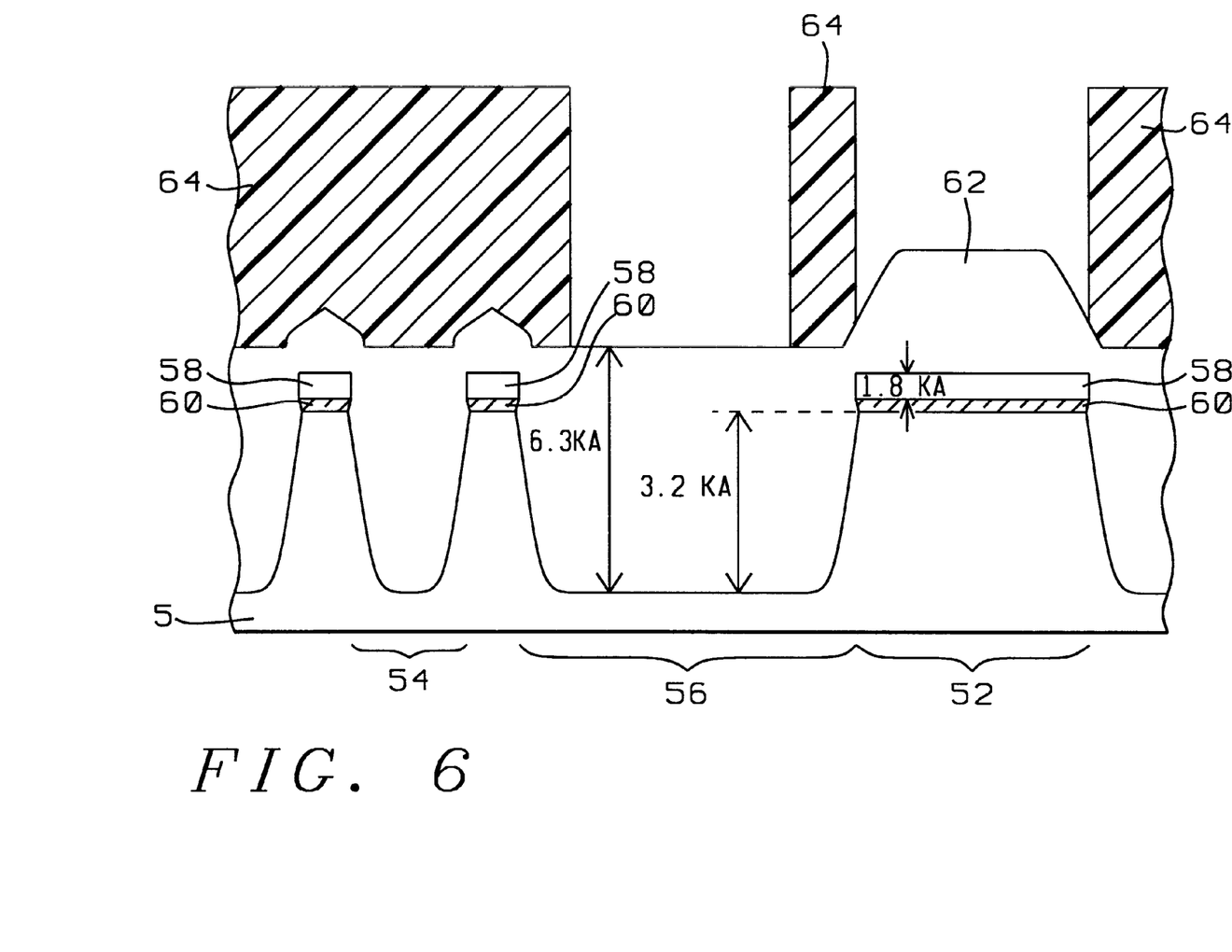

FIG. 6 shows the semiconductor wafer after a high density plasma (HDP) STI gap fill of silicon dioxide (62) and a patterned planarization aid mask (64). The thickness of the silicon dioxide (62) in the UMOS-like gate region (56) is about 6,300 Angstrom (6.3 kA).

Figure 7:
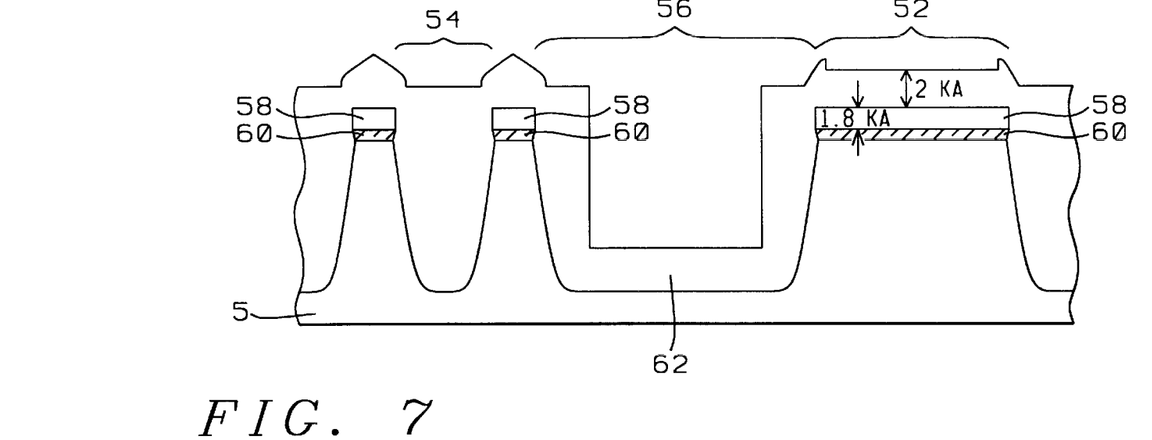

FIG. 7 shows the semiconductor wafer after the silicon dioxide etch of the active region (52) and region (56) where the thickness of the silicon dioxide above the SiN layer (58) in the active region (52) is reduced to 2,000 Angstrom (2 kA).

Figure 8:
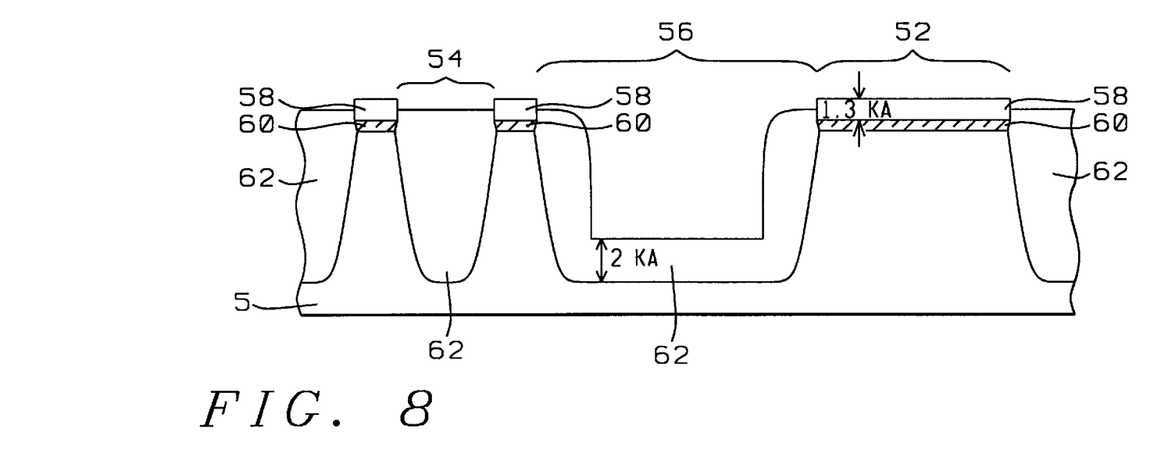

FIG. 8 shows the semiconductor wafer after CMP. The silicon dioxide is removed from the surface of the semiconductor wafer and as a result the thickness of the SiN layer (58) is reduced to 1,300 Angstrom (1.3 kA). The thickness of the silicon dioxide (62) in UMOS-like gate region (56) is now about 2,000 Angstrom (2 kA).

Figure 9:
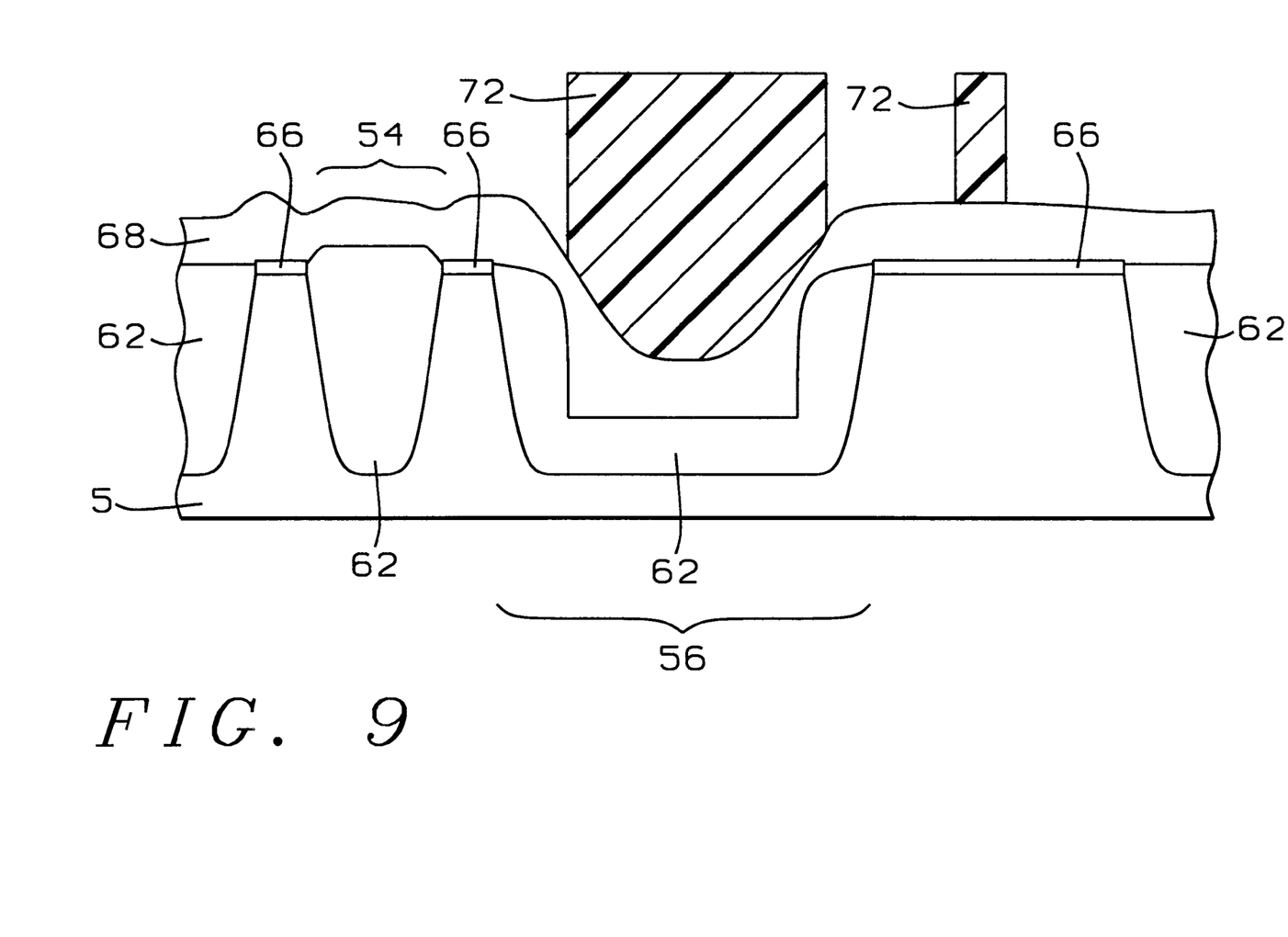

FIG. 9 shows the semiconductor wafer after a nitride etch, oxide strip, gate oxide (66), poly deposition (68), and poly patterned mask (72).

Figure 10:
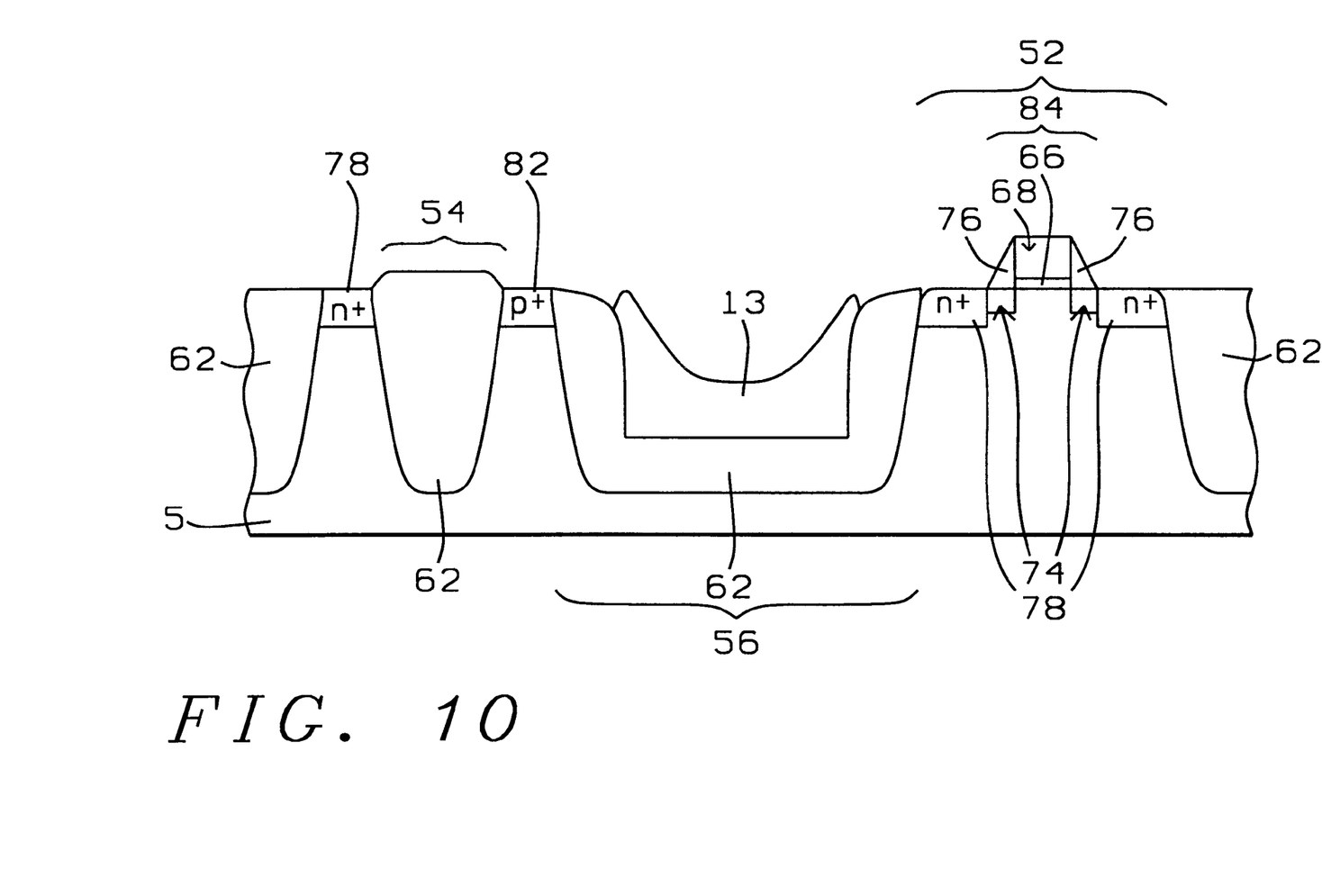

FIG. 10 shows the semiconductor wafer after the poly etch, n-type lightly doped drains (NLDD, 74), p-type lightly doped drains (PLDD, not shown) in the active region (52), spacer deposition (76), spacer etch, and n+ (78) and p+ implants (82). The process finishes up with a standard poly gate (84) and the UMOS-like gate structure (13) for the UGSCR poly gate.

While the invention has been particularly shown and described with reference to the preferred embodiments thereof, it will be understood by those skilled in the art that various changes in form and details may be made without departing from the spirit and scope of the invention.

What is claimed is:

1. A method of creating a UMOS-like gate-controlled thyristor (UGSCR) for electrostatic discharge (ESD) protection, comprising the steps of: providing a semiconductor wafer with a p-substrate; diffusing into said substrate a first and a second n-well, separated from each other;

creating a UMOS-like gate structure by the steps of:
depositing between said first and said second n-well a U type trench and lining it with a silicon dioxide layer;

depositing a polysilicon layer on top of said silicon dioxide layer, said UMOS-like gate structure acting as the gate of said thyristor (UGSCR);

depositing a first n+ diffusion on one side of, and adjacent to, said UMOS-like gate structure, placing said first n+ diffusion partially over said first n-well and said p-substrate;

depositing a first p+ diffusion adjacent to said first n+ diffusion, where said first n+ diffusion and said first p+ diffusion are the cathode of said thyristor;

depositing a first metal layer over said first n+ diffusion and said first p+ diffusion thus providing the contact for said cathode of said thyristor;

depositing into said second n-well a second p+ diffusion on the other side of, and adjacent to, said UMOS-like gate structure;

depositing into said second n-well a second n+ diffusion adjacent to said second p+ diffusion;

depositing a second metal layer over said second p+ diffusion and said second n+ diffusion;

connecting conductively said second p+ diffusion, said second n+ diffusion, and said gate of said thyristor, said second p+ diffusion, said second n+ diffusion, and said gate of said thyristor thus forming the anode of said thyristor;

the above steps further providing:
a parasitic npn bipolar transistor having an emitter, a base and a collector, said emitter, said base, and said collector formed by said first n-well, said p-substrate, and said second n-well, respectively; and a parasitic pnp bipolar transistor having an emitter, a base and a collector, said emitter, said base, and said collector formed by said second p+ diffusion, in said second n-well, and said p-substrate, respectively.

2. The method of claim 1, wherein said n– and said p– conductivity type structures, said cathode and anode, and said npn and pnp transistors are interchanged.

3. The method of claim 1, wherein said thyristor when gated on has an anode to cathode resistance ranging from 1 to 3 Ohms.

4. The method of claim 1, wherein said thyristor when gated on provides an anode to cathode clamping voltage of ranging from 1 to 2 Volts.

5. The method of claim 1, wherein said anode is connected to an input of a circuit to be protected from ESD.

6. The method of claim 1, wherein said cathode is connected to a ground et potential.

7. The method of claim 1, wherein said cathode is alternately connected to said substrate.

8. A method of creating a UMOS-like gate-controlled thyristor (UGSCR) for electrostatic discharge (ESD) protection, comprising the steps of:

providing a semiconductor wafer with a p-substrate;

defining active regions, shallow trench isolation (STI) regions, and UMOS-like gate regions;

depositing a layer of SiN material of 1,800 Angstrom thickness on the top surface of said semiconductor wafer;

creating an oxidized layer underneath said SiN material;

etching said UMOS-like gate regions to a depth ranging from 3,000 to 3,400 Angstrom;

providing a high density plasma (HDP) STI gap fill of silicon dioxide followed by a patterned planarization aid mask, where the thickness of said silicon dioxide in said UMOS-like gate regions ranges from 6,000 to 6,600 Angstrom;

etching said STI gap fill in said active regions and said UMOS-like gate regions, thereby reducing the thickness of said STI gap fill in said active regions to 2,000 Angstrom;

chemical mechanical polishing until said STI gap fill is removed from the surface of said semiconductor wafer thereby reducing the thickness of said SiN material to 1,300 Angstrom and the thickness of said STI gap fill in said UMOS-like gate regions to 2,000 Angstrom;

nitride etching;

oxide stripping;

gate oxide forming;

poly deposition;

poly masking;

poly etching;

creating n-type lightly doped drains (NLDD) and p-type lightly doped drains (PLDD) in said active regions;

spacer deposition;

spacer etching; and implanting n+ and p+ regions.

9. The method of claim 8, wherein said SiN material is silicon nitride.

10. The method of claim 8, wherein said oxidized layer is a silicon dioxide layer.

* * * * *

UNITED STATES PATENT AND TRADEMARK OFFICE
CERTIFICATE OF CORRECTION

PATENT NO. : 6,458,632 B1
DATED : October 1, 2002
INVENTOR(S) : Jun Song, Guang Ping Hua and Keng-Foo Lo It is certified that error appears in the above-identified patent and that said Letters Patent is hereby corrected as shown below:

<u>Column 6,</u>
Line 56, please delete the word "et".

Signed and Sealed this

Eleventh Day of March, 2003

JAMES E. ROGAN
*Director of the United States Patent and Trademark Office*